(12) United States Patent
Chun et al.

(10) Patent No.: US 6,891,767 B2
(45) Date of Patent: May 10, 2005

(54) SEMICONDUCTOR MEMORY DEVICE AND METHOD FOR PRE-CHARGING THE SAME

(75) Inventors: Ki Chul Chun, Yongin (KR); Kyu Chan Lee, Seoul (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 88 days.

(21) Appl. No.: 10/392,079

(22) Filed: Mar. 20, 2003

(65) Prior Publication Data

US 2003/0206471 A1 Nov. 6, 2003

(30) Foreign Application Priority Data

May 6, 2002 (KR) .............................. 10-2002-0024799

(51) Int. Cl.$^7$ .............................................. G11C 7/00
(52) U.S. Cl. ..................................... 365/203; 365/204
(58) Field of Search ................................ 365/203, 204, 365/205, 207, 190

(56) References Cited

U.S. PATENT DOCUMENTS 5,684,745 A * 11/1997 Kim et al. ............. 365/189.11
5,926,425 A * 7/1999 Morimoto ................... 365/204
6,097,652 A * 8/2000 Roh ........................... 365/205

* cited by examiner

*Primary Examiner*—Anh Phung
(74) *Attorney, Agent, or Firm*—Harness Dickey

(57) ABSTRACT

A semiconductor memory device and a method for pre-charging the same, the semiconductor memory device comprising a plurality of memory cell array blocks, each having a plurality of memory cells connected between respective bit line pairs and respective word line pairs, a plurality of pairs of data input/output lines connected to the respective bit line pairs for transferring data, a first pre-charge circuit for pre-charging the bit line pairs to a first pre-charge voltage during a first operation, a second pre-charge circuit for pre-charging the data input/output line pairs and the first pre-charge voltage to the first pre-charge voltage during the first operation, a plurality of third pre-charge circuits, each being disabled in the first operation and pre-charges the data input/output line pairs in the corresponding memory cell array blocks to a second pre-charge voltage during a second operation, and a discharging circuit for lowering the first pre-charge voltage when the first pre-charge voltage is greater than a desired voltage level during the first operation.

16 Claims, 6 Drawing Sheets

US 6,891,767 B2

1

SEMICONDUCTOR MEMORY DEVICE AND METHOD FOR PRE-CHARGING THE SAME

This U.S. nonprovisional patent application claims priority under 35 U.S.C. § 119 of Korean Patent Application 2002-24799 filed on May 6, 2002, the entire contents of which is hereby incorporated by reference.

BACKGROUND OF INVENTION

1. Field of the Invention

The present invention relates to a semiconductor memory device, more particularly to a semiconductor memory device capable of reducing or preventing data reading failure and a method for pre-charging the same.

2. Description of Related Art

Generally, a semiconductor device includes a first pre-charge circuit for pre-charging a pair of bit lines to a half power supply voltage, a second pre-charge circuit for pre-charging the first pre-charge circuit and a pair of data input/output lines to a half power supply voltage, and a third pre-charge circuit for pre-charging the pair of data input/output lines in a selected memory cell array block out of a plurality of memory cell array blocks during an active and a read operations to a power supply voltage.

In a conventional semiconductor memory device, pre-charge is performed such that a third pre-charge circuit pre-charges a pair of data input/output lines in a selected memory cell array block to a power supply voltage during a read operation, and a second pre-charge circuit pre-charges a pair of data input/output lines in a selected memory cell array to a half power supply voltage during a pre-charge operation.

FIG. 1 illustrates a schematic diagram of a semiconductor memory device in accordance with the conventional art. As shown in FIG. 1, the conventional semiconductor memory device includes a plurality of memory cell array blocks 10-1, ..., 10-(k−1) and 10-k, a row decoder 12, a column decoder 14, a plurality of data input/output multiplexers 16-11, ..., 16-kk, a plurality of data input/output sense amplifiers 18-11 to 18-kk, a power supply voltage IVC generating circuit 20, a pre-charge voltage VBL generating circuit 22. The semiconductor memory device further includes bit line pre-charge circuits BLPRE1 connected to bit line pairs (ABL1, ABL1B), (ABL2, ABL2B), ..., respectively, arranged on a left side of the memory cell array blocks 10-1 to 10-k, and bit line pre-charge circuits BLPRE2 connected to bit line pairs (ABL1, ABL1B), (ABL2, ABL2B), ..., respectively, arranged on a right side of the memory cell array blocks 10-1 to 10-k. The semiconductor memory device also further includes sense amplifiers BLSA 24 connected to sense bit line pairs (SBL1, SBL1B), (SLB2, SBL2B), ..., respectively, in the respective memory cell array blocks 10-1 to 10-k, data input/output gates (DIOG), bit line isolating gates ISOG1 connected between the respective sense bit line pairs (SBL1, SBL1B), (SLB2, SBL2B), ..., and the respective array bit line pairs (ABL1, ABL1B), (ABL2, ABL2B), ..., arranged on the left side of the memory cell array blocks 10-1 to 10-k, bit line isolating gates ISOG2 connected between the respective sense bit line pairs (SBL1, SBL1B), (SLB2, SBL2B), ... and the respective array bit line pairs (ABL1, ABL1B), (ABL2, ABL2B), ... arranged on the right side of the memory cell array blocks 10-1 to 10-k, pre-charge circuits IVCPRE11 ... and IVCPREkk connected to the respective data input/output lines (IO11, IO11B), ... and (IOkk, IOkkB), pre-charge circuits VBLPRE11, ..., and VBLPREkk, data input/output

2 multiplexers (IOMUX) 16-11, ..., and 16-kk and data input/output sense amplifiers (IOSA) 18-11, ..., and 18-kk.

In FIG. 1, the data input/output line pairs (IO11, IO11B)-(IOkk, IOkkB) are signal lines common to adjacent memory cell array blocks 10-n, 10-(n+1). Further, circuits connected to the data input/output line pairs (IO11, IO11B)-(IOkk, IOkkB) are common to the adjacent memory cell array blocks 10-n, 10-(n+1). Further, circuits connected to the sense bit line pairs (SBL1, SBL1B), (SBL2, SBL2B), ... are common to the adjacent memory cell array blocks 10-n, 10-(n+1).

Each of the data input/output gates DIOG comprises NMOS transistors N1 and N2. Each of the bit line isolating gates ISOG1, ISOG2 comprises NMOS transistors N3 and N4. Each of the bit line pre-charge circuits BLPRE1, BLPRE2 comprises of NMOS transistors N5, N6 and N7. Each of the pre-charge circuits IVCPRE11-IVCPREkk comprises NMOS transistors N8, N9 and N10. Each of the pre-charge circuits VBLPRE11-VBLPREkk comprises NMOS transistors N11, N12 and N13.

Functions of each block shown in FIG. 1 will be described below.

The row decoder 12 decodes a row address RA and generates word line section signals WL1-WLm. The column decoder 14 decodes a column address CA and generates column selection signals CSL1-CSLn. The respective data input/output gates DIOG are turned on in response to the respective column selection signals CSL1-CSLn and transfer data between the respective sense bit line pairs (SBL1, SBL1B), (SBL2, SBL2B) and the respective data input/output line pairs (IO11, IO11B)-(IOkk, IOkkB). The bit line sense amplifier 24 amplifies voltage difference between each sense bit line pair (SBL1, SBL1B), (SBL2, SBL2B), ... The bit line isolation gates ISOG1, ISOG2 are turned on in response to bit isolation control signals ISO1, ISO2, ..., of a power supply voltage level during a pre-charge operation, and completely turned on in response to the bit line isolation control signals ISO1, ISO2, ..., of a high voltage level during an active operation. Each of the pre-charge circuits BLPRE1, BLPRE2 pre-charges the array bit line pairs (ABL1, ABL1B), (ABL2, ABL2B), ... and the sense bit line pairs (SBL1, SBL1B), (SBL2, SBL2B), ... to a voltage VBL level in response to the pre-charge control signals PRE1, PRE2, ...

A value of the voltage VBL is a half power supply voltage value. Each of the pre-charge control signals PRE1, PRE2, ... is transitioned from logic "low" level to logic "high" level in response to a corresponding block selection signal which is used for selecting the respective memory cell array blocks 10-1 to 10-k. Each of the pre-charge circuits IVCPRE11-IVCPREkk charges the respective data input/output line pairs (IO11, IO11B)-(IOkk, IOkkB) to a power supply voltage IVC in response to respective pre-charge control signals A11-Akk. Each of the pre-charge circuits VBLPRE11-VBLPREkk pre-charges the data input/output pairs (IO11, IO11B)-(IOkk, IOkkB) to the voltage VBL in response to respective pre-charge control signals B11-Bkk. Each of the data input/output multiplexers 16-11 to 16-kk transmits respective output signals of the data input/output sense amplifiers 18-11 to 18-kk to the respective data input/output line pairs (IO11, IO11B)-(IOkk, IOkkB) in response to the block selection signal during a write operation, and transmits respective signals of the data input/output line pairs (IO11, IO11B)-(IOkk, IOkkB) to the respective data input/output sense amplifiers 18-11 to 18-kk in response to a block selection signal during a read operation. The data input/output sense amplifiers 18-11 to 18-kk amplify current differences between respective output signals output from the data input/output multiplexers 16-11 to 16-kk and then output the amplified signals.

A read operation of the semiconductor memory device shown in FIG. 1 is described below, wherein a memory cell array block 10-1 of the memory cell array blocks 10-1 to 10-k is selected for data reading.

When the array bit line pairs (ABL1, ABL1B), (ABL2, ABL2B), . . . and the sense bit line pairs (SBL1, SBL1B), (SBL2, SBL2B) . . . are pre-charged, and an active command is applied along with the row address RA and a block address (not shown), the row decoder 12 decodes the row address RA and generates a word line selection signal WL1 for selecting a word line in the memory cell array 10-1. If a block selection signal for selecting the memory cell array block 10-1 is generated in response to a block address, the bit line pre-charge control signal PRE1 transitions from logic "high" level to logic "low" level, and the bit line isolation control signal ISO1 transitions from logic "low" level to logic "high" level in response to the block selection signal. Then, the pre-charge circuits PRE1, PRE2 are turned off, and the bit line isolation gates ISOG1, ISOG2 are completely turned on, so that a charge sharing operation occurs between the memory cells connected to a word line activated in response to the word line selection signal WL1 and the array bit line pairs (ABL1, ABL1B), (ABL2, ABL2B). As a result, a voltage difference is generated between the sense bit line pairs (SBL1, SBL1B), (SBL2, SBL2B), and the bit line sense amplifier BLSA 24 operates to amplify the voltage difference. At this time, the control signals A11, A12 transitions to logic "high" level and the control signals B11, B12 transitions to logic "low" level. Then, the multiplexers 16-11 and 16-12 are turned on. Accordingly, the data input/output line pairs (IO11, IO11B), (IO12, IO12B) transitions to a power supply voltage IVC level.

If the read command and the column address are applied together, the column decoder 14 decodes a column address CA and generates a column selection signal CSL1. The data input/output gates DIOG are turned on in response to the column selection signal CSL1 to transmit the amplified signal of the sense bit line pairs (SBL1, SBL1B), (SBL2, SBL2B) to the data input/output line pairs (IO11, IO11B), (IO12, IO12B). The data transmitted to the data input/output line pairs (IO11, IO11B), (IO12, IO12B) are output through the data input/output multiplexers 16-11, 16-12. The data input/output sense amplifiers 18-11, 18-12 amplify current differences between signals output from the data input/output multiplexers 16-11, 16-12. That is, when the data input/output line pairs (IO11, IO11B), (IO12, IO12B) are pre-charged to the power supply voltage IVC level and the data input/output gates (IO11, IO11B), (IO12, IO12B) are turned on, the data input/output line (or complementary data input/output line) connected to the sense bit line (or complementary sense bit line) of logic "high" level maintains the power supply voltage IVC level, but the complementary data input/output line (or the data input/output line) connected to the complementary sense bit line (or the sense bit line) of logic "low" level loses voltage. Accordingly, current does not flow between the sense bit line (or complementary sense bit line) and the data input/output line (or complementary data input/output line) but flows between the complementary sense bit line (or sense bit line) and the complementary data input/output line (or data input/output line). At this time, the data input/output sense amplifiers 18-11, 18-12 amplify current differences between the data input/output line pairs (IO11, IO11B), (IO12, IO12B) and output the amplified signal.

After the read operation is performed, a pre-charge command is applied. At this time, the pre-charge control signal PRE1 and control signals B11, B12 transition to logic "high" level, and control signals A11, A12 transition to logic "low" level. Accordingly, the array bit line pairs (ABL1, ABL1B), (ABL2, ABL2B) and the sense bit line pairs (SBL1, SBL1B), (SBL2, SLB2) are pre-charged to the voltage VBL1 level, and the data input/output line pairs (IO11, IO11B), (IO12, IO12B) are pre-charged to the voltage VBL level from the power supply voltage IVC level. Thus, charges on the data input/output line pairs (IO11, IO11B), (IO12, IO12B) are drawn to the voltage VBL line through the NMOS transistors N12, N13 forming the pre-charge circuits VBLPRE11, VBLPRE12. At this time, the data input/output line pairs (IO11, IO11B), (IO12, IO12B) may not be discharged completely because the voltage VBL generating circuit has low driving capability, so that voltage level of the voltage VBL line increases.

Accordingly, the pre-charge level of the array bit line pairs (ABL1, ABL1B), (ABL2, ABL2B), . . . in the memory cell array blocks 10-1 to 10-k, the sense bit line pairs (SBL1, SBL1B), (SBL2, SBL2B), . . . , and the data input/output line pairs (IO11, IO11B)-(IOkk, IOkkB) increases.

As a result, when charge sharing occurs between the selected memory cells and the bit line pair, the voltage difference decreases, so that it causes a problem that the bit line sense amplifiers may not correctly amplify signals of the bit line pairs.

FIG. 2 illustrates a conventional voltage VBL generating circuit 22 including PMOS transistors P1, P2 and P3, and NMOS transistors N14, N15 and N16.

Operation of the voltage VBL generating circuit in FIG. 2 is described below.

If a voltage level of a node A is a half power supply voltage ½ IVC, a voltage level of a node C becomes (½ IVC+VTN) and a voltage level of a node D becomes (½ IVC−VTP), where VTN and VTP are threshold voltages of the NMOS and PMOS transistors N14 and P2, respectively. The NMOS transistor 14 and the PMOS transistor P2 are almost turned on, i.e. not completely turned on, and a stable ½ IVC level is generated and transmitted to the voltage VBL generating line.

In this situation, if the output voltage VOUT level is lowered, resistance of the PMOS transistor P1 decreases and resistance of the NMOS transistor N15 increases, so that the voltage of the node A increases. Then, the voltage of the node C increases but the voltage of the node D decreases, so that the NMOS transistor N16 is turned on and the PMOS transistor P3 is turned off. As a result, the voltage of the node B increases.

On the other hand, if the output voltage VOUT increases, resistance of the PMOS transistor P1 increases and resistance of the NMOS transistor N15 decreases, so that the voltage of the node A decreases. Then, the voltage of the node C decreases but the voltage of the node D increases, so that the NMOS transistor N16 is turned off and the PMOS transistor P3 is turned on. As a result, the voltage of the node B decreases.

As described above, the voltage VBL generating circuit 22 generates a signal with stable voltage VBL level.

The voltage VBL generating circuit in FIG. 2 may have a high driving capability when magnitude of variation of the voltage VBL level is great.

Accordingly, only increasing a size of transistors in the voltage VBL generating circuit may not help lower a voltage level of the voltage VBL generating line and smoothly discharge the charges on the voltage VBL generating line, the charges being drawn from the data input/output line pairs in a selected memory cell array block when operation of the semiconductor memory device changes from the read operation to the pre-charge operation.

That is, increasing the size of the transistors in the voltage VBL generating circuit is not a good solution to lower the voltage level of the voltage VBL generating line, because this solution increases current consumption and layout area of the voltage VBL generating circuit.

An industry trend is that an integration degree of semiconductor memory devices increases and operating voltage decreased. However, as the integration degree increases and the operating voltage decrease, current driving capability of transistors in the semiconductor memory device decreases, and it has become more difficult to pre-charge the data input/output lines to a stable half power supply voltage level during the pre-charge operation. That is, during a normal pre-charge operation following the read operation, the second pre-charge circuit discharges data input/output lines so that charges on the data input/output lines are drawn to a half power supply voltage generating circuit. However, because the driving capability of the transistor is low, the data input/output lines are not sufficiently discharged. As a result, the pre-charge voltage level of the data input/output lines increases when each the pre-charge operation is performed.

SUMMARY OF THE INVENTION

Exemplary embodiments of the present invention provide a semiconductor device capable of reducing or preventing data reading operation failure and a method for pre-charging the same.

In accordance with an exemplary embodiment, the present invention provides a semiconductor memory device comprising a plurality of memory cell array blocks, each having a plurality of memory cells connected between respective bit line pairs and respective word line pairs, a plurality of pairs of data input/output lines connected to the respective bit line pairs for transferring data, a first pre-charge circuit for pre-charging the bit line pairs to a first pre-charge voltage during a first operation, a second pre-charge circuit for pre-charging the data input/output line pairs and the first pre-charge voltage to the first pre-charge voltage during the first operation, a plurality of third pre-charge circuits, each being disabled in the first operation and enabled to pre-charge the data input/output line pairs in the corresponding memory cell array blocks to a second pre-charge voltage during a second operation, and a discharging circuit for lowering the first pre-charge voltage when the first pre-charge voltage is greater than a desired voltage level during the first operation.

In an exemplary embodiment, the first pre-charge voltage value equals half of the second pre-charge voltage.

In an exemplary embodiment, the first operation is a pre-charge operation.

In an exemplary embodiment, the discharging circuit comprises a first transistor connected to the first pre-chare voltage and a ground voltage and turned on for a desired time during the pre-charge operation.

In an exemplary embodiment, the discharging circuit further comprises a second transitor acting as a diode, which is connected between the first transistor and the ground voltage.

In an exemplary embodiment, the first operation is a normal mode operation.

In an exemplary embodiment, the discharging circuit comprises a first transistor which is enabled during the normal mode operation, and connected between the first pre-charge voltage and a ground voltage.

In an exemplary embodiment, the discharging circuit further comprises a second transistor acting as a diode, the second transistor being connected between the first transistor and the ground voltage.

In an exemplary embodiment, the first operation is a pre-charge operation which is performed during a normal mode operation.

In an exemplary embodiment, the discharging circuit comprises a first transistor enabled during the normal operation and connected to the first pre-charge voltage, and a second transistor connected in series between the first transistor and the ground voltage and turned on for a predetermined time.

In an exemplary embodiment, the discharging circuit further comprises a third transistor acting as a diode, which is connected in series between the second transistor and the ground voltage.

In accordance with another exemplary embodiment, the present invention provides a method for pre-charging a semiconductor memory device including a plurality of memory cell array blocks, each having a plurality of memory cells connected between respective bit line pairs and respective word line pairs, and a plurality of data input/output line pairs, each pair connected to the respective bit line pairs in the respective memory cell array blocks for transferring data, comprising pre-charging the data input/output line pairs in a selected memory cell array block out of the memory cell array blocks to a first pre-charge voltage during a first operation, and pre-charging the bit line pairs in the memory cell array blocks and the data input/output line pairs to a second pre-charge voltage during a second operation, and lowering the first pre-charge voltage level when the first pre-charge voltage level is greater than a desired voltage level.

In an exemplary embodiment, a value of the second pre-charge voltage is a half of the first pre-charge voltage value.

In an exemplary embodiment, the second operation is a pre-charge operation.

In an exemplary embodiment, the second operation is a normal mode operation.

In an exemplary embodiment, the second operation is a pre-charge operation which is performed during a normal mode operation.

BRIEF DESCRIPTION OF THE DRAWINGS

Exemplary embodiments of the present invention will be readily apparent to those of ordinary skill in the art upon review of the detailed description that follows when taken in conjunction with the accompanying drawings, in which like reference numerals denote like parts, and in which.

DETAILED DESCRIPTION OF EXEMPLARY EMBODIMENTS

Reference will now be made in detail to exemplary embodiments of the present invention, which are illustrated in the accompanying drawings.

Figure 3:
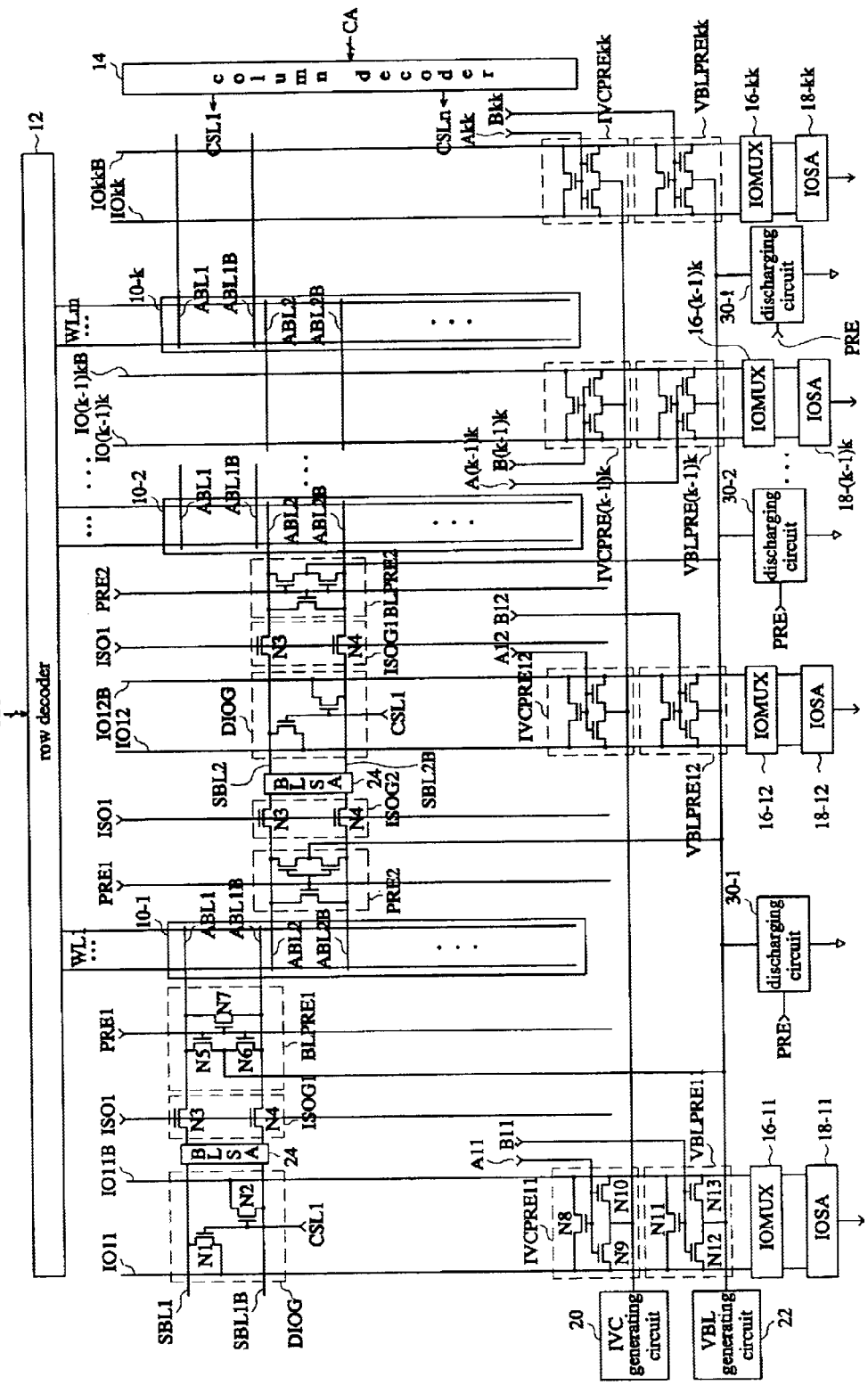
FIG. 3 illustrates a schematic block diagram of a semiconductor memory device in accordance with an exemplary embodiment of the present invention.

FIG. 3 illustrates a semiconductor memory device in accordance with an exemplary embodiment of the present invention. Referring to FIG. 3, the semiconductor memory device in accordance with an exemplary embodiment of the present invention is implemented by providing discharging circuits 30-1 to 30-l between the voltage VBL generating line and a ground voltage.

Figure 1:
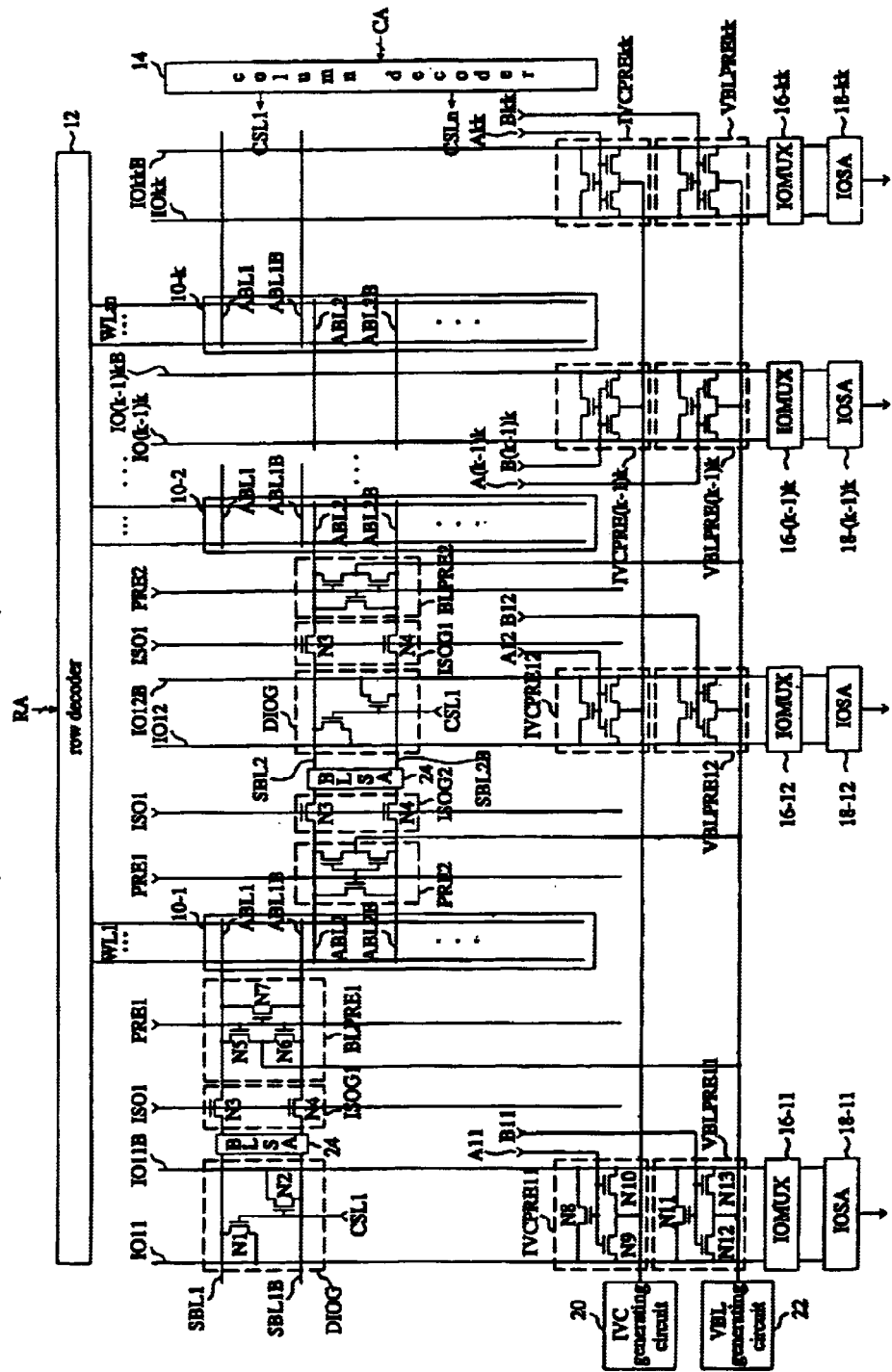
FIG. 1 illustrates a schematic block diagram of a conventional semiconductor memory device.
Figure 2:
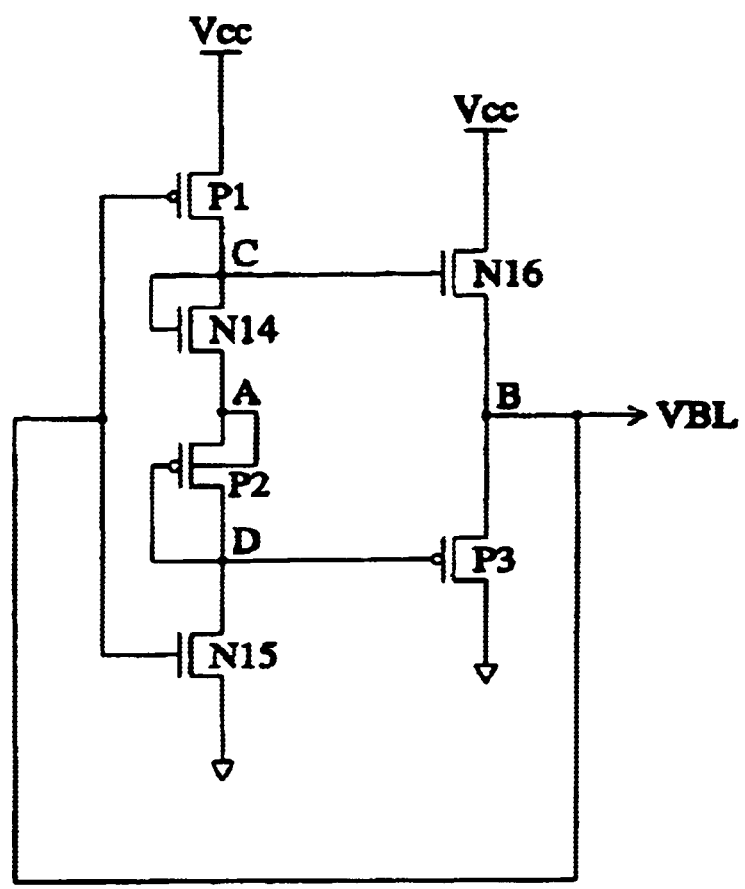
FIG. 2 illustrates a circuit diagram of a voltage VBL generating circuit in FIG. 1.

Like reference symbol or number in FIG. 3 and FIG. 1 denotes like elements. Operation of the semiconductor memory device of the exemplary embodiments of the present invention may the same as the operation of the conventional semiconductor memory device. Discussion of the discharge operation is set forth below.

In the semiconductor memory device of exemplary embodiments of the present invention, charges of a voltage VBL generating line are discharged through one or more discharging circuits 30-1 to 30-l during a pre-charge operation. Accordingly, it is possible to reduce or prevent voltage level rise of the voltage VBL generating line during the pre-charge operation.

FIGS. 4A, 4B, 5A, 5B, 6A and 6B illustrate exemplary embodiments of discharging circuits shown in FIG. 3.

Figure 4A:
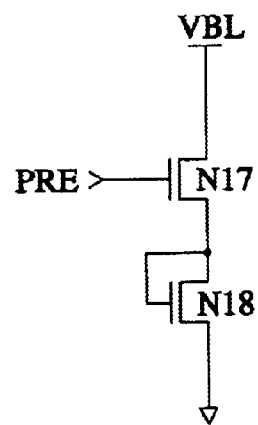
FIGS. 4A and 4B illustrate exemplary circuit diagrams of a discharging circuit shown in FIG. 3.

Referring to FIG. 4A, the discharging circuit 30-1 may include NMOS transistors N17, N18 connected in series between the voltage VBL generating line and the ground voltage. Operation of the circuit of FIG. 4A is described below.

During the pre-charge operation, if the NMOS transistor N17 is turned on in response to a pre-charge control signal PRE, and a voltage level of the voltage VBL generating line is greater than threshold voltage of the NMOS transistor N18, charges on the voltage VBL generating line are discharged via the NMOS transistors N17 and N18. The pre-charge control signal PRE may be a pulse signal generated for a desired of time.

Figure 4B:
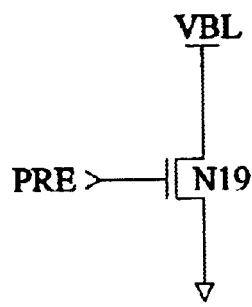

Referring to FIG. 4B, the discharging circuit 30-1 may include an NMOS transistor N19 connected between the voltage VBL generating line and the ground voltage. Operation of the circuit of FIG. 4B will be described below.

During the pre-charge operation, if the NMOS transistor N19 is turned on in response to the pre-charge control signal PRE, charges on the voltage VBL generating line are discharged via the NMOS transistor N19.

Figure 5A:
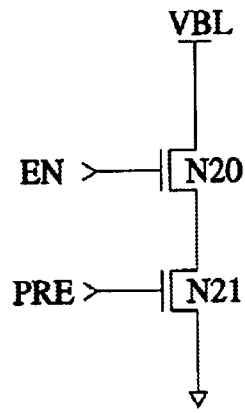
FIGS. 5A and 5B illustrate other exemplary circuit diagrams of a discharging circuit shown in FIG. 3.

Referring to FIG. 5A, the discharging circuit 30-1 may include NMOS transistors N20, N21 connected in series between the voltage VBL generating line and the ground voltage. Operation of the circuit of FIG. 5A is described below.

In response to an enable signal EN, the NMOS transistor N20 is turned on and an operation of the discharging circuit is enabled. Further, the NMOS transistor N21 is turned on in response to the pre-charge control signal PRE and the voltage VBL generating line is discharged for a described time through the NMOS transistors N20 and N21.

In a normal mode, the enable signal EN having logic "high" level is applied and operation of the discharging circuit is enabled. On the other hand, in a test mode, the enable signal EN having logic "low" level is applied and operation of the discharging circuit is disabled. That is, the discharging circuit may be controlled to operate only during a desired operation mode.

Figure 5B:
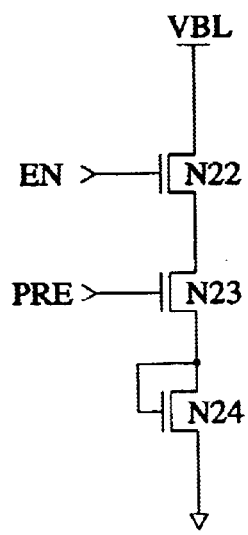

FIG. 5B illustrates a discharging circuit 30-1 in accordance with another exemplary embodiment of the present invention. Referring to FIG. 5B, the discharging circuit 30-1 may include NMOS transistors N22, N23 and N24 connected in series between the voltage VBL generating line and the ground voltage. Operation of the circuit of FIG. 5B is described below.

In response to an enable signal EN, the NMOS transistor N22 is turned on and operation of the discharging circuit is enabled. Further, in response to the pre-charge control signal PRE, the NMOS transistor 23 is turned on. At this time, if voltage level of the voltage VBL generating line is greater than threshold voltage of the NMOS transistor N24, charges on the voltage VBL generating line are drawn to the ground voltage through the NMOS transistors N22, N23 and N24, so that the voltage VBL generating line may be completely discharged.

Figure 6A:
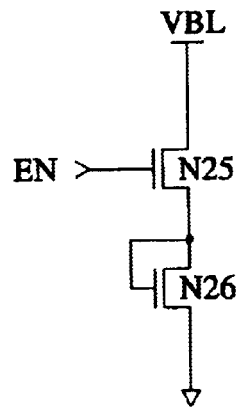
FIGS. 6A and 6B illustrate other exemplary circuit diagrams of a discharging circuit shown in FIG. 3.

Referring to FIG. 6A, the discharging circuit 30-1 may include NMOS transistors N25, N26 connected in series between the voltage VBL generating line and the ground voltage. Operation of the circuit of FIG. 6A is described below.

In response to an enable signal EN, the NMOS transistor N25 is turned on. At this time, if voltage level of the voltage VBL generating line is greater than threshold voltage of the NMOS transistor N26, charges on the voltage VBL generating are drawn to the ground through the NMOS transistors N25 and N26, i.e. the voltage VBL generating line is completely discharged.

Figure 6B:
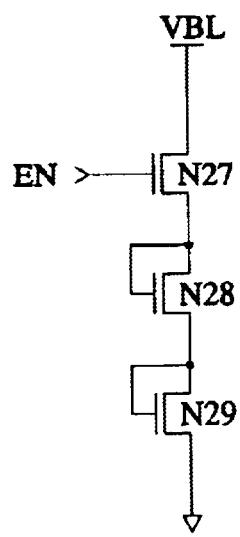

FIG. 6B illustrates a discharging circuit 30-1 in accordance with another exemplary embodiment of the present invention. Referring to FIG. 6B, the discharging circuit 30-1 may include NMOS transistors N27, N28 and N29 connected in series between the voltage VBL generating line and the ground voltage. Operation of the circuit of FIG. 6B is described below.

In response to an enable signal EN, the NMOS transistor N27 is turned on. At this time, if voltage level of the voltage VBL generating line is greater than sum of threshold voltages of the NMOS transistors N28 and N29, charges on the voltage VBL generating line are drawn to the ground voltage through the NMOS transistors N27, N28 and N29, so that the voltage VBL generating line may be completely discharged.

The discharging circuits shown in FIGS. 4A and 4B operate when the pre-charge operation starts in the normal and test modes. On the other hand, the discharging circuits shown in FIGS. 5A and 5B operate when the pre-charge operation is selectively performed in the normal operation mode or the test mode. The discharging circuits shown in FIGS. 6A and 6B operate only in one mode out of the test mode and the normal operation mode.

As described above, by changing the number of the transistors acting as diodes, the transistors connected between the voltage VBL generating line and the ground voltage, it is possible to adjust the voltage level of the voltage VBL generating line. That is, when the voltage level of the voltage VBL generating line is lowered below a desired voltage, the discharging operation may stop. The desired voltage of the voltage VBL generating line is adjusted based on the number of the transistors between the voltage VBL generating line and the ground voltage.

Accordingly, the semiconductor memory device in accordance with the exemplary embodiment of the present invention is capable of reducing or preventing the voltage level of the voltage VBL generating line from being greater than a desired voltage.

While the present invention has been particularly shown and described with reference to exemplary embodiments thereof, it will be understood by those skilled in the art that the foregoing and other changes in form and details may be made therein without departing from the spirit and scope of the present invention.

What is claimed is:

1. A semiconductor memory device comprising:
   a plurality of memory cell array blocks, each having a plurality of memory cells connected between respective bit line pairs and respective word line pairs;
   a plurality of pairs of data input/output lines connected to the respective bit line pairs for transferring data;
   a first pre-charge circuit for pre-charging the bit line pairs to a first pre-charge voltage during a first operation;
   a second pre-charge circuit for pre-charging the data input/output line pairs and the first pre-charge voltage to the first pre-charge voltage during the first operation;
   a plurality of third pre-charge circuits, each being disabled in the first operation and enabled to pre-charge the data input/output line pairs in the corresponding memory cell array blocks to a second pre-charge voltage during a second operation; and
   a discharging circuit for lowering the first pre-charge voltage when the first pre-charge voltage is greater than a desired voltage level during the first operation.

2. The semiconductor memory device according to claim 1, wherein the first pre-charge voltage equals to a half of the second pre-charge voltage.

3. The semiconductor memory device according to claim 1, wherein the first operation is a pre-charge operation.

4. The semiconductor memory device according to claim 3, wherein the discharging circuit includes a first transistor connected to the first pre-charge voltage and a ground voltage and turned on for a desired time during the pre-charge operation.

5. The semiconductor memory device according to claim 4, wherein the discharging circuit further includes a second transistor acting as a diode, which is connected between the first transistor and the ground voltage.

6. The semiconductor memory device according to claim 1, wherein the first operation is a normal mode operation.

7. The semiconductor memory device according to claim 6, wherein the discharging circuit includes a first transistor which is enabled during the normal mode operation, and connected between the first pre-charge voltage and the ground voltage.

8. The semiconductor memory device according to claim 7, wherein the discharging circuit further includes a second transistor acting as a diode, the second transistor being connected between the first transistor and the ground voltage.

9. The semiconductor memory device according to claim 1, wherein the first operation is a pre-charge operation which is performed during a normal mode operation.

10. The semiconductor memory device according to claim 9, wherein the discharging circuit includes:
    a first transistor enabled during the normal operation and connected to the first pre-charge voltage;
    a second transistor connected in series between the first transistor and the ground voltage and turned on for a desired time.

11. The semiconductor memory device according to claim 10, wherein the discharging circuit further includes:
    a third transistor acting as a diode, which is connected in series between the second transistor and the ground voltage.

12. A method for pre-charging a semiconductor memory device including a plurality of memory cell array blocks, each having a plurality of memory cells connected between respective bit line pairs and respective word line pairs, and a plurality of data input/output line pairs, each pair connected to the respective bit line pairs in the respective memory cell array blocks for transferring data, comprising:
    pre-charging the data input/output line pairs in a selected memory cell array block of the memory cell array blocks to a first pre-charge voltage during a first operation; and
    pre-charging the bit line pairs in the memory cell array blocks and the data input/output line pairs to a second pre-charge voltage during a second operation, and lowering the first pre-charge voltage level when the first pre-charge voltage level is greater than a desired voltage level.

13. The method according to claim 12, wherein the second pre-charge voltage is a half of the first pre-charge voltage value.

14. The method according to claim 12, wherein the second operation is a pre-charge operation.

15. The method according to claim 12, wherein the second operation is a normal mode operation.

16. The method according to claim 12, wherein the second operation is a pre-charge operation which is performed during a normal mode operation.

* * * * *